United States Patent
Fischer (10) Patent No.: US 7,345,488 B2
(45) Date of Patent: Mar. 18, 2008

(54) APPARATUS AND METHOD FOR DETERMINING A FAULTED PHASE OF A THREE-PHASE UNGROUNDED POWER SYSTEM

(75) Inventor: Normann Fischer, Colfax, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 141 days.

(21) Appl. No.: 11/251,246

(22) Filed: Oct. 14, 2005

(65) Prior Publication Data
US 2007/0085549 A1    Apr. 19, 2007

Related U.S. Application Data

(60) Provisional application No. 60/686,510, filed on Jun. 1, 2005.

(51) Int. Cl.
  G01R 31/08   (2006.01)
  G01R 31/14   (2006.01)
  G01R 31/00   (2006.01)
  H02H 9/08    (2006.01)

(52) U.S. Cl. ............... 324/521; 324/522; 324/525; 324/509; 361/42; 702/58

(58) Field of Classification Search ............. 324/521, 324/522, 525, 509; 361/42; 702/58
See application file for complete search history.

(56) References Cited

U.S. PATENT DOCUMENTS

| | | | | |
|---|---|---|---|---|
| 5,428,549 | A * | 6/1995 | Chen | 702/59 |
| 5,515,227 | A * | 5/1996 | Roberts et al. | 361/67 |
| 6,518,767 | B1 * | 2/2003 | Roberts et al. | 324/521 |
| 6,721,671 | B2 * | 4/2004 | Roberts | 702/58 |
| 6,760,670 | B2 * | 7/2004 | Stoupis et al. | 702/58 |
| 6,785,105 | B2 | 8/2004 | Roberts et al. | |
| 6,845,333 | B2 | 1/2005 | Anderson et al. | |
| 6,934,654 | B2 | 8/2005 | Benmouyal | |
| 2004/0021995 | A1 * | 2/2004 | Roberts et al. | 361/42 |

OTHER PUBLICATIONS

Negative-Sequence Impedance Directional Element by Bill Fleming, Schweitzer Engineering Laboratories, Inc., Pullman, WA USA, Copyright SEL 1998.
Rebirth Of Negative-Sequence Quantities In Protective Relaying With Microprocessor-Based Relays by Fernando Calero, Schweitzer Engineering Laboratories, Inc., La Paz, Bolivia, Copright SEL 2003.

* cited by examiner

Primary Examiner—Andrew H. Hirshfeld
Assistant Examiner—Amy He
(74) Attorney, Agent, or Firm—Cook, Alex, McFarron, Manzo, Cummings & Mehler, Ltd.

(57) ABSTRACT

Provided is an apparatus and method for determining a faulted phase resulting from a fault in a three-phase ungrounded power system. The method includes comparing a phase angle of an operating phasor to a phase angle of a fixed reference phasor. The operating phasor is derived from a digitized signal sample of a plurality of measured signals of the power system. The method also includes comparing a phase angle difference between the operating phasor and the fixed reference phasor to at least one threshold to determine the faulted phase. The fixed reference phasor may be a phase-to-phase voltage or a positive sequence voltage of the plurality of measured signals of the power system. The operating phasor may be a zero sequence current, a zero sequence voltage or a combination of a zero sequence current and a zero sequence voltage of the plurality of measured signals of the power system.

29 Claims, 9 Drawing Sheets

APPARATUS AND METHOD FOR DETERMINING A FAULTED PHASE OF A THREE-PHASE UNGROUNDED POWER SYSTEM

CROSS-REFERENCE TO RELATED APPLICATIONS

This application claims benefit under 35 U.S.C. §119(e) of U.S. Provisional Application No. 60/686,510 entitled "An Apparatus and Method for Determining a Faulted Phase of a Three-Phase Ungrounded Power System", filed on Jun. 1, 2005, naming Normann Fischer as inventor, the complete disclosure thereof being incorporated by reference.

BACKGROUND OF THE INVENTION

The present invention generally relates to power system protection, and more specifically, to an apparatus and method for determining a faulted phase of a three-phase ungrounded power system.

Electric utility systems or power systems are designed to generate, transmit and distribute electrical energy to loads. In order to accomplish this, power systems generally include a variety of power system elements such as electrical generators, electrical motors, power transformers, power transmission lines, buses and capacitors, to name a few. As a result, power systems must also include protective devices and procedures to protect the power system elements from abnormal conditions such as electrical short circuits, overloads, frequency excursions, voltage fluctuations, and the like.

Such protective devices and procedures act to isolate some power system element(s) from the remainder of the power system upon detection of the abnormal condition or a fault in, or related to, the power system element(s).

Power system protection may be grouped into six types including: (1) generators and generator-transformer elements (2) transformers, (3) buses, (4) lines (transmission, sub-transmission and distribution), (5) utilization equipment (motors, static loads), and (6) capacitor or reactor banks. As a result, a variety of protective devices are required. Such protective devices may include different types of protective relays, surge protectors, arc gaps and associated circuit breakers and reclosers.

Although the fundaments of power system protection are similar, each of the six types of power system protection use protective devices that are based on the characteristics of the power system elements in that category. More specifically, different protective relays utilizing a variety of protective schemes (e.g., differential current comparisons, magnitude comparisons, frequency sensing), are required to protect the various power system elements.

For example, an overcurrent relay is designed to provide overcurrent protection against faults occurring on a distribution line of an ungrounded power system. Using power system current information, if the overcurrent relay senses a current that exceeds a threshold, it sends a trip signal to a power circuit breaker which then opens to isolate the faulty distribution line (faulty line) from the remainder of the power system.

Because power system currents can easily exceed 10,000 amperes (amps) and power system voltages can reach several hundred thousand volts, and because a protective device, such as the overcurrent relay described above, is designed to measure currents no greater than 100 amps and measure voltages no greater than a few hundred volts, the protective device is coupled to the power system element(s) via a number of current and/or voltage transformers (CT and VT). The CT and VT may be arranged in one of a number of arrangements (e.g., grounded wye, ungrounded delta). During operation, the current transformers and voltage transformers proportionally step-down the power system voltage and current (while retaining the same phase relation) flowing into the protection zone, to a magnitude that can be readily monitored and measured by the protective device.

As is known, the three-phase current flowing into the protected line is commonly referred to as a primary current, and the current flowing from the current transformers to the protective device is commonly referred to as a secondary current. Likewise the voltage present on the protected line is commonly referred to as primary voltage, and the voltage delivered to the protective device is commonly referred to as secondary voltage. When received by the protective device, the resulting lower secondary currents and voltages can be filtered, sampled, etc., to determine corresponding phasors representative of the primary voltages and primary current flowing into the protected line. The phasors are then used in the various protective relay logic schemes, such as, for example, in the overcurrent scheme of the overcurrent relay to calculate the magnitude of the currents.

In some instances the protective device must not only detect the presence of a power system fault, but must also determine which of the three power system phases is faulted. When the power system is grounded, determining the faulted phase often is as easy as determining which phase conductor carries the largest current. When the power system is ungrounded, determining the faulted phase is often as easy as determining which phase conductor carries the smallest voltage with respect to ground (the phase-to-ground voltage). In actual practice however, three-phase ungrounded power systems typically employ open delta voltage transformer banks to provide stepped-down phase-to-phase voltages to the protective device, and broken delta voltage transformer banks to provide zero-sequence voltage to the protective device. These typical transformer arrangements do not allow the protective device to directly measure the phase-to-ground voltage of the protected line.

SUMMARY OF THE INVENTION

In accordance with the invention, provided is an apparatus for determining a faulted phase resulting from a fault in a three-phase ungrounded power system. The apparatus includes a means for deriving a plurality of digitized signal samples from a corresponding plurality of measured signals of the three-phase ungrounded power system, and a microcontroller operatively coupled to the means for deriving. The microcontroller includes a microprocessor and a memory operatively coupled to the microprocessor. The microcontroller is programmed to calculate a magnitude and phase angle of a fixed reference phasor, determine an operating phasor, calculate a magnitude and phase angle of the operating phasor based on at least one of the plurality of digitized signal samples, calculate a phase angle difference between the operating phasor and the fixed reference phasor, and compare the phase angle difference to at least one threshold to determine the faulted phase. The fixed reference phasor may be a phase-to-phase voltage or a positive sequence voltage of the plurality of measured signals of the power system. The operating phasor may be a zero sequence current, a zero sequence voltage or a combination of a zero sequence current and a zero sequence voltage of the plurality of measured signals of the power system.

In accordance with another embodiment of the invention, provided is a method for determining a faulted phase resulting from a fault in a three-phase ungrounded power system. The method includes comparing a phase angle of an operating phasor to a phase angle of a fixed reference phasor. The operating phasor is derived from a digitized signal sample of a plurality of measured signals of the power system. The method also includes comparing a phase angle difference between the operating phasor and the fixed reference phasor to at least one threshold to determine the faulted phase. The fixed reference phasor may be a phase-to-phase voltage or a positive sequence voltage of the plurality of measured signals of the power system. The operating phasor may be a zero sequence current, a zero sequence voltage or a combination of a zero sequence current and a zero sequence voltage of the plurality of measured signals of the power system.

In accordance with yet another embodiment of the invention, provided is a method for determining a faulted phase resulting from a fault in a three-phase ungrounded power system. The method includes calculating a magnitude and phase angle of a fixed reference phasor where the fixed reference phasor derived from a first digitized signal sample of a plurality of measured signals of the power system. The method also includes calculating a magnitude and phase angle of an operating phasor where the operating phasor derived from a second digitized signal sample of the plurality of measured signals of the power system, calculating a phase angle difference between the operating phasor and the fixed reference phasor, and comparing the phase angle difference to at least one threshold to determine the faulted phase. The fixed reference phasor may be a phase-to-phase voltage or a positive sequence voltage of the plurality of measured signals of the power system. The operating phasor may be a zero sequence current, a zero sequence voltage or a combination of a zero sequence current and a zero sequence voltage of the plurality of measured signals of the power system.

It should be understood that the present invention includes a number of different aspects or features which may have utility alone and/or in combination with other aspects or features. Accordingly, this summary is not exhaustive identification of each such aspect or feature that is now or may hereafter be claimed, but represents an overview of certain aspects of the present invention to assist in understanding the more detailed description that follows. The scope of the invention is not limited to the specific embodiments described below, but is set forth in the claims now or hereafter filed.

DETAILED DESCRIPTION OF THE INVENTION

For ease of discussion, aspects of the present invention can be more fully understood by limiting the detailed discussion to a directional overcurrent relay. It should be noted however, that the apparatus and methods described herein are equally applicable to any number of protective devices of the three-phase power system that utilize phasor quantities during operation.

Figure 1:
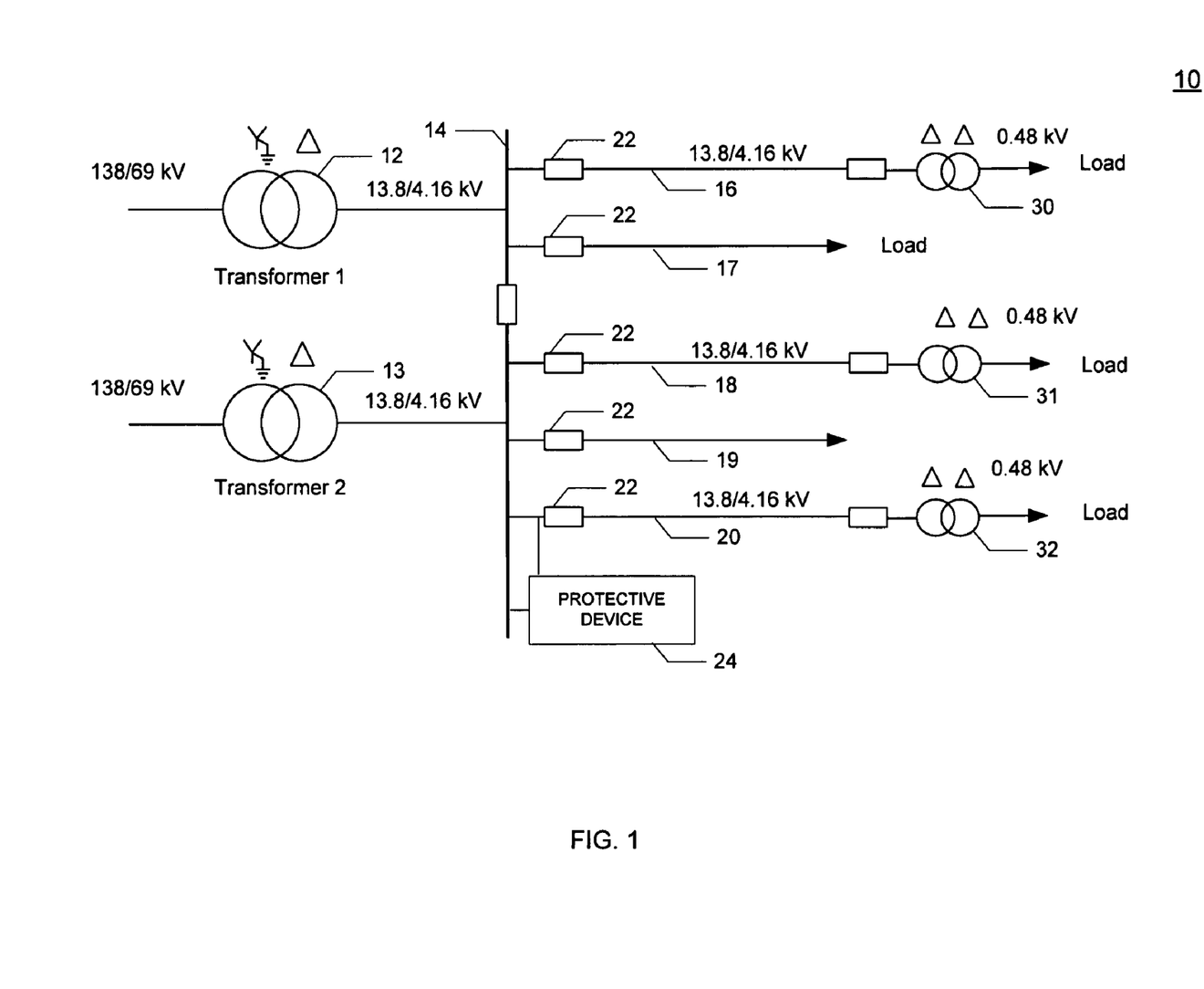
FIG. 1 is a single line schematic diagram of an ungrounded power system that may be utilized in a typical metropolitan area.

FIG. 1 is a single line schematic diagram of a three-phase ungrounded power system 10 that may be utilized in a typical metropolitan area. As illustrated in FIG. 1, the ungrounded power system 10 includes, among other things, two power transformers 12, 13 configured to step-down 138 kV three-phase sinusoidal waveforms, to lower voltage 13.8 kV three-phase sinusoidal waveforms. Each of the two power transformers 12, 13 include a first winding (on the higher voltage side) having a grounded wye configuration, and a second winding (on the lower voltage side) having an ungrounded delta configuration. As a result of the second winding having the ungrounded delta configuration, the A-, B- and C-phases of the transmission, the sub-transmission and distribution lines of the power system 10 are also ungrounded.

The ungrounded power system 10 also includes a busbar 14 configured to, among other things, distribute the lower voltage power resulting from operation of the power transformers 12, 13, to sub-transmission lines, or feeders, 16, 17, 18, 19 and 20. Also included are a number of circuit breakers 22 configured to cause associated power system element(s) to be disconnected from the ungrounded power system 10 in response to a trip signal from a corresponding protective device such as the protective device shown in FIG. 1. Such a trip signal may be issued by the protective device upon detection of a phase-to-ground fault in the A-phase of the sub-transmission line 20. Although many types of protective devices are used to protect the various elements of the ungrounded power system 10, for ease of discussion, the protective device of FIG. 1 will be discussed as a directional overcurrent relay 24, it being understood that other types of apparatus and method for detecting a faulted phase on an ungrounded power system may be utilized by other protective devices.

Referring again to FIG. 1, three additional power transformers 30, 31 and 32 are also included to step-down the lower voltage three-phase sinusoidal waveforms (e.g., 13.8 kV sinusoidal waveforms) to lower voltage 0.48 kV three-phase sinusoidal waveforms suitable for distribution via distribution lines to various end users and loads. Each of the two winding of the three power transformers 30, 31, 32, are configured as an ungrounded delta configuration.

As previously mentioned, the ungrounded power system 10 includes protective devices and procedures to protect the power system elements from faults or other abnormal conditions. The protective devices and procedures utilize a variety of protective logic schemes to determine whether a fault or other problem exists in the ungrounded power system 10. For example, some types of protective relays utilize a current differential comparison to determine whether a fault exists in the protection zone. Other types of protective relays compare the magnitudes of calculated phasors, representative of the three-phase sinusoidal waveforms, to determine whether a fault exists in the protection zone. Frequency sensing techniques and harmonic content detection is also incorporated in protective relays to detect fault conditions. Similarly, thermal model schemes are utilized by protective relays to determine whether a thermal problem exists in the protection zone.

Figure 2:
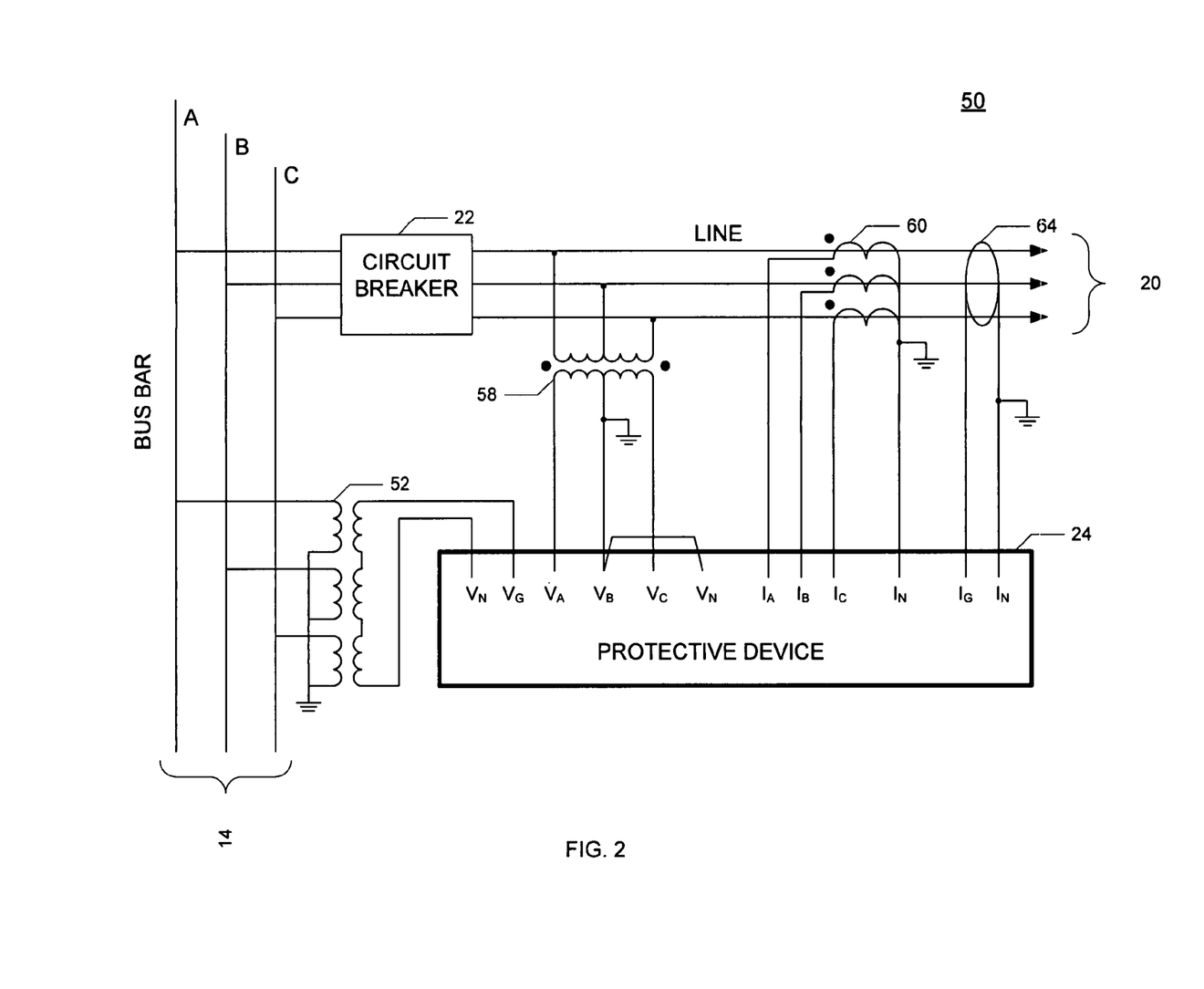
FIG. 2 is a more detailed block diagram of a protective device configured to determine a faulted phase in the ungrounded power system of FIG. 1, according to an embodiment of the invention.

FIG. 2 is a more detailed block diagram of the directional overcurrent relay 24 configured to determine a faulted phase of the ungrounded power system 10, according to an embodiment of the invention. As illustrated, the directional overcurrent relay 24 is operatively coupled to the transmission line 20 and busbar 14 via a number of transformer groups to monitor the A-phase, the B-phase and the C-phase primary sinusoidal current signals and associated voltage signals of the sub-transmission line 20. Although illustrated using the directional overcurrent relay 24, it should be noted that other types of protective devices may be utilized to implement the apparatus and methods disclosed herein.

In general, the directional overcurrent relay 24 utilizes the A-phase, B-phase and C-phase secondary sinusoidal current signals provided by a number of current transformers to provide directional overcurrent protection for the transmission line 20. Each of the current transformers is configured to step-down the magnitudes of the primary sinusoidal current signals to corresponding secondary sinusoidal current signals, suitable for use by the directional overcurrent relay 24, where each of the A-phase, B-phase and C-phase primary sinusoidal current signals is equal to respective secondary sinusoidal current signals multiplied by current transformer ratios (turn ratios) of the current transformers. Similarly, the directional overcurrent relay 24 utilizes the A-phase, B-phase and C-phase secondary voltage signals provided by a number of voltage transformers to measure phase-to-phase voltages (e.g., $V_{CA}$) and phase-to-ground voltages (e.g., $V_{AG}$) of the sub-transmission line 20. During operation, the directional overcurrent relay 24 processes each of the secondary sinusoidal current signals and each of the secondary voltage signals to form phasors (i.e., a complex number used in the context of steady state alternating linear systems). Each phasor has a magnitude and phase angle. Calculations utilizing the magnitudes and phase angles of the phasors are performed to determine if a short circuit or fault exists in any of the A-phase, B-phase, and/or C-phase of the sub-transmission line 20.

More specifically, a (wye-grounded) broken delta voltage transformer group 52 is included to operatively couple the directional overcurrent relay 24 to the busbar 14 for purposes of measuring the zero sequence voltage represented as a zero sequence phasor $V_0$, when a phase-to-ground fault occurs. An open delta voltage transformer group 58 is included for purposes of enabling the directional overcurrent relay 24 to measure the phase-to-phase voltages of the transmission line 20. A current transformer group 60 and/or a flux summation current transformer 64 is also included.

As is known, for a balanced power system with an A-, B-, C-phase sequence, each of the phasors derived from the corresponding secondary current signals is of equal magnitude and has a phase shift of 120 degrees. For example, when expressed in polar form, $\bar{I}_A = I\angle 0°$, $\bar{I}_B = I\angle -120°$, and $\bar{I}_C = I\angle 120°$, under "balanced" conditions, the three phasors rotate counterclockwise. By convention, the "positive" sequence (the order in which phasors appear when passing a fixed point) is sequence $I_A$, $I_B$, $I_C$, and the "negative" sequence is sequence $I_A$, $I_C$, $I_B$. A balanced power system with an A-, C-, B-phase sequence is also possible. For such power systems, the conventions for positive- and negative-sequence are reversed from those of an A-, B-, C-phase sequence power system.

As is also known, a fault condition (e.g., an A-phase-to-ground fault) typically results in an "unbalanced" condition yielding, for example, A-, B- and C-current phasors having varied magnitudes with phase angles that are not 120 degrees apart. When presented with such a fault condition, the directional overcurrent relay 24 executing its protective scheme, (1) decomposes the unbalanced currents into one three-phase balanced set of phasors with positive-sequence rotation, one three-phase balanced set of phasors having negative-sequence rotation and one three-phase balanced set of three phasors that are in phase (i.e., the "zero" sequence), and (2) performs protective calculations. Decomposing the unbalanced currents into positive-, negative- and zero-sequence phasor sets facilitates calculations in polar form where multiplication of two phasors simply requires multiplication of their magnitudes and addition of their phase angles, and division of two phasors simply requires division of their magnitudes and subtraction of their phase angles. It should be noted that the calculations discussed herein are performed using complex numbers in their polar form and are plotted on a phasor diagram (or complex plane) for ease of illustration. (see, FIGS. 3, 4, 6, 7, 8).

Figure 3:
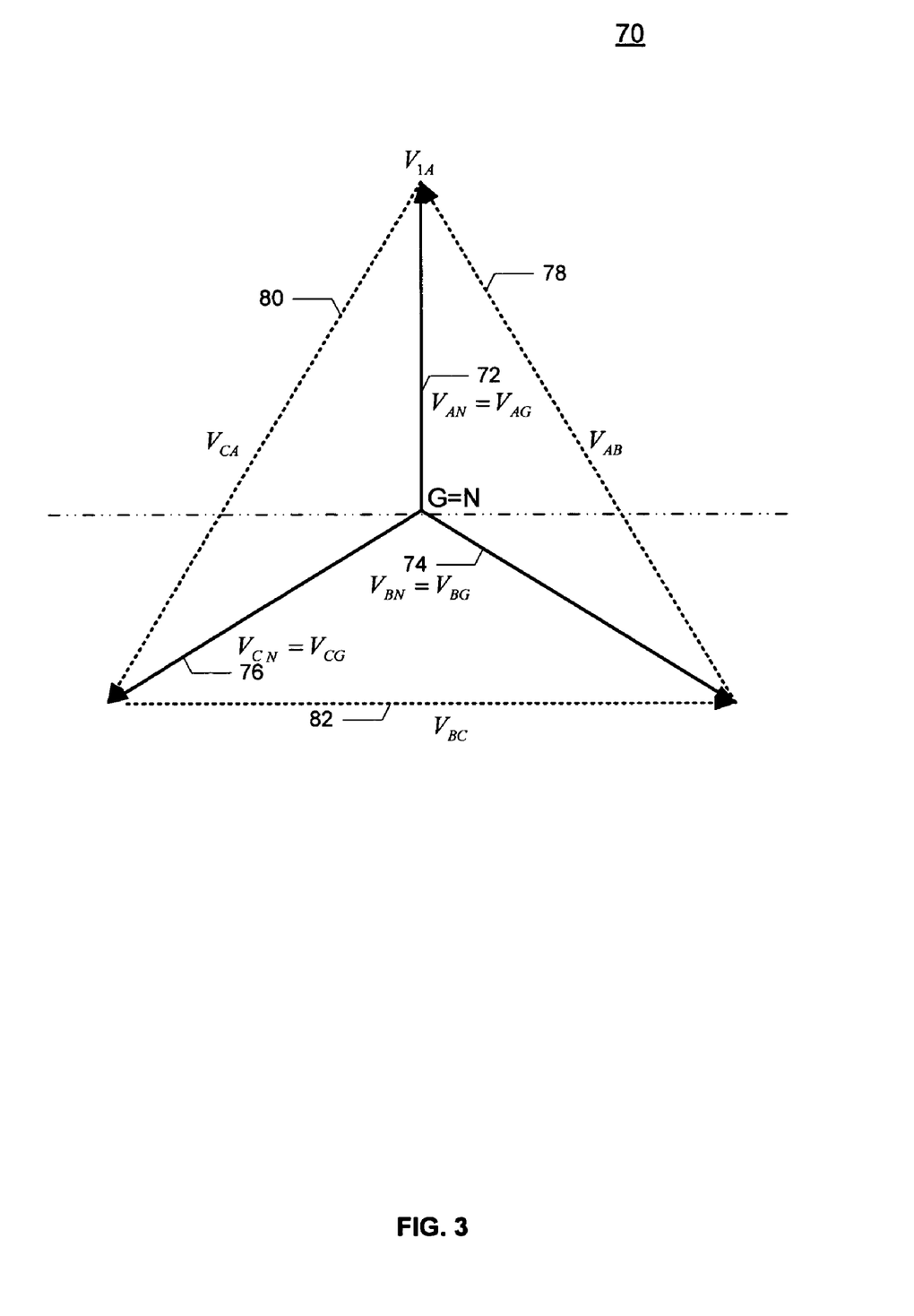
FIG. 3 is a pre-fault phasor diagram of the ungrounded power system of FIG. 1 during balanced and un-faulted conditions.

FIG. 3 is a pre-fault phasor diagram 70 of the ungrounded power system 10 during balanced and un-faulted conditions. As illustrated, the ground reference point and the neutral point are at the same potential. The A-phase-to-neutral voltage is represented by an A-phase-to-neutral phasor $V_{AN}$ 72 having a magnitude of one and oriented at 0 degrees. During balanced and un-faulted conditions, the A-phase-to-neutral phasor $V_{AN}$ 72 is equal to an A-phase positive sequence voltage $V_{1A}$. In this instance, the A-phase positive sequence voltage $V_{1A}$ is selected as the fixed reference phasor. The B-phase-to-neutral voltage is represented by a B-phase-to-neutral phasor $V_{BN}$ 74 having a magnitude of one and oriented at negative 120 degrees, and the C-phase-to-neutral voltage is represented by a C-phase-to-neutral phasor $V_{CN}$ 76 having a magnitude of one and oriented at positive 120 degrees.

As illustrated in FIG. 3, the phase angle between the B-phase-to-neutral phasor $V_{BN}$ 74 and the C-phase-to-neutral phasor $V_{CN}$ 76 is 120 degrees, and the sum of the A-phase-to-neutral phasor $V_{AN}$ 72 plus the B-phase-to-neutral phasor $V_{BN}$ 74 plus the C-phase-to-neutral phasor $V_{CN}$ 76, is zero. In addition, the A-phase-to-neutral phasor $V_{AN}$ 72 is equal to an A-phase-to-ground phasor $V_{AG}$, the B-phase-to-neutral phasor $V_{BN}$ 74 is equal to a B-phase-to-ground phasor $V_{BG}$ and the C-phase-to-neutral phasor $V_{CN}$ 76 is equal to a C-phase-to-ground phasor $V_{CG}$.

When a phase-to-ground fault occurs however, the sum of the A-phase-to-ground phasor $V_{AG}$ 72, the B-phase-toground phasor $V_{BG}$ 74 and the C-phase-to-ground phasor $V_{CG}$ 76 is no longer zero, and the A-phase-to-neutral phasor $V_{AN}$ 72 is not equal to the A-phase-to-ground phasor $V_{AG}$ or the A-phase positive sequence voltage $V_{1A}$. Likewise, the B-phase-to-neutral phasor $V_{BN}$ 74 is not equal to the B-phase-to-ground phasor $V_{BG}$ and the C-phase-to-neutral phasor $V_{CN}$ 76 is not equal to the C-phase-to-ground phasor $V_{CG}$.

Figure 4:
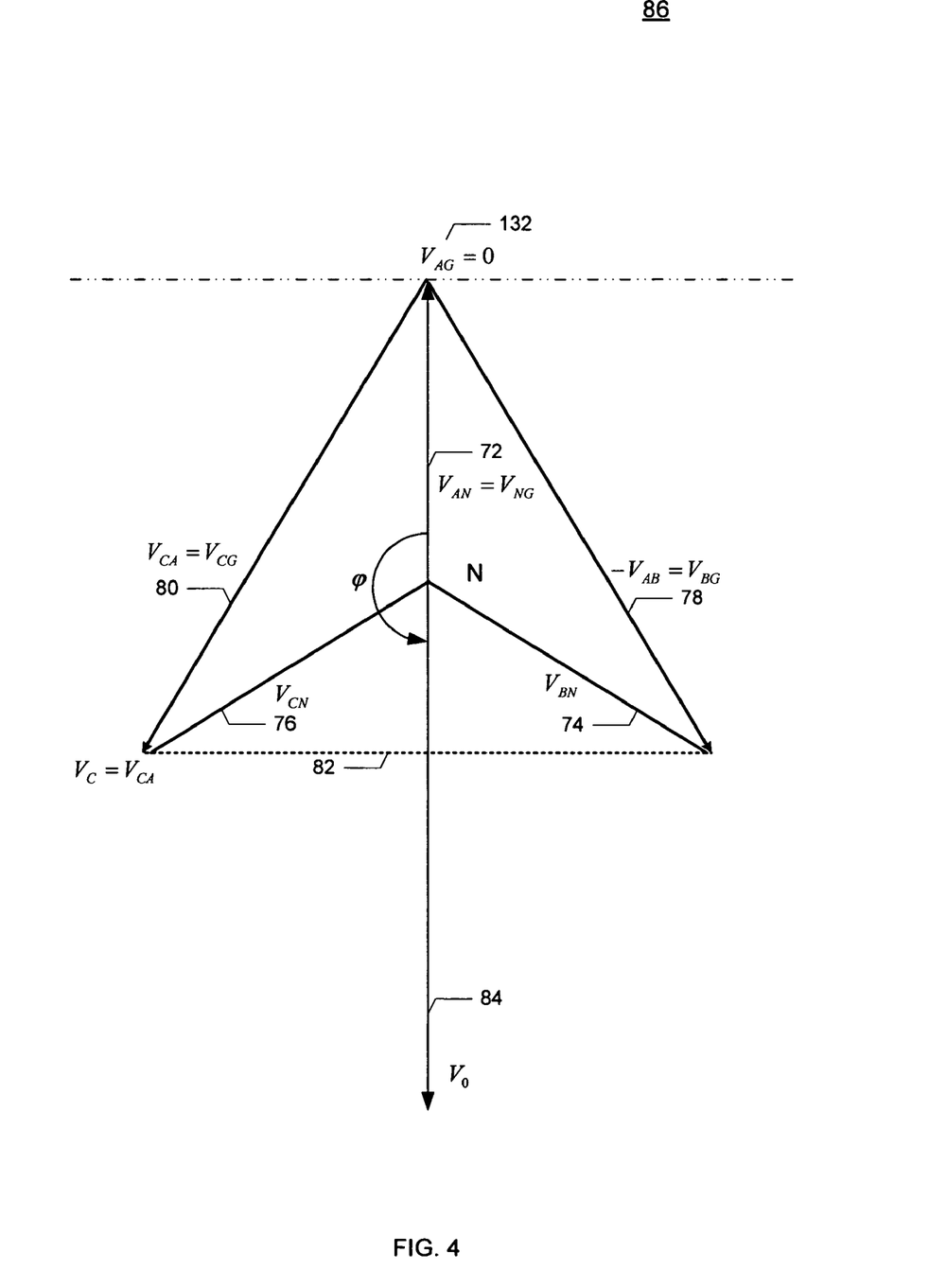
FIG. 4 is an A-phase-to-ground fault phasor diagram of the ungrounded power system of FIG. 1.

For example, FIG. 4 is a phasor diagram 86 of the ungrounded power system 10 during an A-phase-to-ground fault. As illustrated, during an A-phase-to-ground fault having about zero fault resistance $R_f$ between the A-phase conductor and ground (or a "solid" A-phase-to-ground fault), the ground and the neutral point are at different potentials with the A-phase-to-ground phasor $V_{AG}$ equal to zero.

Referring to FIG. 4, when the solid A-phase-to-ground fault occurs, the A-phase-to-ground phasor $V_{AG}$ 72 collapses as its magnitude goes to zero. At the same time, the un-faulted phase-to-ground voltages, or the B-phase-to-ground voltage phasor $V_{AG}$ and the C-phase-to-ground voltage phasor $V_{CG}$, increase in magnitude by a factor of $\sqrt{3}$. In addition, the B-phase-to-ground phasor $V_{BG}$ is oriented at negative 150 degrees while the C-phase-to-ground phasor $V_{CG}$ is oriented at positive 150 degrees. Accordingly, the phase angle between the B-phase-to-ground phasor $V_{BG}$ and the C-phase-to-ground phasor $V_{CG}$ is reduced to 60 degrees (from 120 degrees).

As a result of the solid A-phase-to-ground fault, the sum of the A-phase-to-ground phasor $V_{AG}$ 132, the B-phase-to-ground phasor $V_{BG}$ 78 and the C-phase-to-ground phasor 80 $V_{CG}$, or the zero sequence voltage phasor $3V_0$ 84 has a voltage magnitude equal to three times that of the pre-fault A-phase-to-ground fault magnitude (or three times that of the A-phase line-to neutral voltage). In addition, the phase angle of the resulting residual, or zero sequence voltage phasor $V_0=(V_{AG}+V_{BG}+V_{CG})$ is 180 degrees out of phase with its corresponding pre-fault voltage phasor. In other words, the neutral shift is the zero sequence voltage $V_0$ and the resulting A-phase zero sequence voltage phasor $V_0$ 84 points in a direction opposite to that of its corresponding faulted phasor $V_{AN}$ 72 (i.e., positive/negative 180 degrees).

Similarly, when a solid B-phase-to-ground fault occurs, the B-phase-to-ground phasor $V_{BG}$ 74 collapses as its magnitude become zero and a resulting B-phase zero sequence voltage phasor points in a direction opposite of the B-phase-to-neutral phasor $V_{BN}$ 74 (i.e., positive 60 degrees), and when a solid C-phase-to-ground fault occurs, the C-phase-to-ground phasor $V_{CG}$ 76 collapses as its magnitude become zero and a resulting C-phase zero sequence voltage phasor points in a direction opposite of the C-phase-to-neutral phasor $V_{CN}$ 76 (i.e., negative 60 degrees). Thus as can be seen in FIG. 2, when a solid A-phase-, B-phase-, or C-phase-to-ground fault occurs, the resulting zero sequence voltage phasor points away from the faulted phase. Accordingly, for a solid phase-to-ground fault (e.g., solid C-phase-to-ground fault), the phase-to-ground phasor (e.g., C-phase-to-ground phasor $V_{CG}$ 76) associated with the faulted phase ceases to exist and therefore is not available for use in determining the faulted phase.

As will be appreciated by those skilled in the art, the zero sequence voltage phasor $V_0$, is capable of having varying magnitudes up to three times the magnitude of its corresponding pre-faulted phase magnitude, depending on the resistance of the phase-to-ground fault. That is, for fault resistances $R_f$ much less than the zero sequence capacitive reactance of the ungrounded power system 10 (the system zero sequence capacitive reactance $XC_{SYS_0}$), the magnitude of the faulted phase-to-ground phasor (e.g., $V_{AG}$ 72) approaches zero and the magnitude of the zero sequence voltage phasor during a phase-to-ground fault approaches its maximum of three times $V_0$, whereas for fault resistances $R_f$ much larger than system zero sequence capacitive reactance $XC_{SYS_0}$, the magnitude of the faulted phase-to-ground phasor decreases only slightly below 1 and the magnitude of the zero sequence voltage phasor during a phase-to-ground fault approaches its minimum of 0. For ease of discussion, the fault resistance $R_f$ during a phase-to-ground fault may range from an about zero resistance phase-to-ground fault (less than an ohm), or a solid phase-to-ground fault, to a maximum resistance phase-to-ground fault (in kilo ohms) where the maximum resistance is much greater than the system zero sequence capacitive reactance $XC_{SYS_0}$.

Referring again to FIG. 2, the open delta voltage transformer group 58 is also included to operatively couple the directional overcurrent relay 24 to the transmission line 20 for purposes of enabling the directional overcurrent relay 24 to measure the phase-to-phase voltages between the A-phase, the B-phase and the C-phases. The open delta voltage transformer group 58 is also capable of providing positive- and negative-sequence voltages to the directional overcurrent relay 24. The open delta transformer group 58 utilizes two voltage transformers to provide an A-phase to B-phase voltage and a C-phase to B-phase voltage, from which an A-phase to C-phase voltage can be calculated. $V_N$ represents a neutral terminal on the relay.

Referring again to FIG. 3, the A-phase to B-phase voltage may be represented by a $V_{AB}$ phase-to-phase phasor 78, the C-phase to B-phase voltage may be represented by a $V_{CB}$ phase-to-phase phasor 82 and the C-phase to A-phase voltage may be represented as a $V_{CA}$ phase-to-phase phasor 80.

Referring again to FIG. 2, the directional overcurrent relay 24 is additionally coupled to the transmission line 20 via the current transformer group 60 and/or the flux summation current transformer 64. The current transformer group 60 includes three current transformers adapted to provide secondary A-phase, B-phase and C-phase currents to the directional overcurrent relay 24. The flux summation current transformer 64, is configured to measure the residual (primary) current of the power system 10 the A-phase, the B-phase and the C-phase current (i.e., $I_A+I_B+I_C$)

Figure 5:
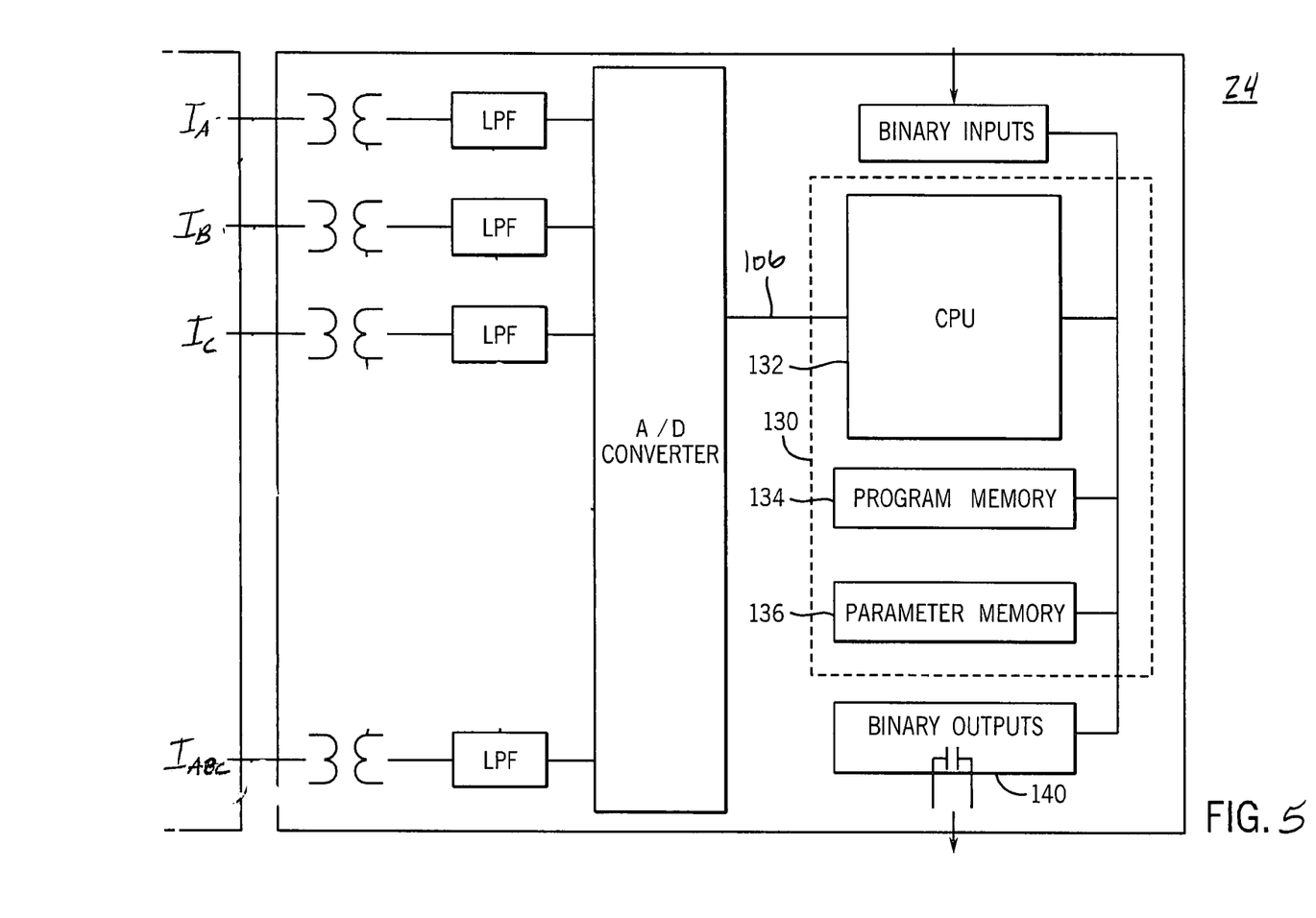
FIG. 5 is a block diagram of an exemplary configuration of the protective device of FIG. 1.

For example, FIG. 5 is a block diagram of an exemplary configuration of the directional overcurrent relay 24. In general, the directional overcurrent relay 24 processes each of the A-phase, B-phase and C-phase secondary sinusoidal current samples provided by the current transformer group 60 to form corresponding A-phase, B-phase and C-phase current phasors. Similarly, the directional overcurrent relay 24 processes the residual (primary) current provided by the flux summation current transformer 64. Although not separately illustrated in FIG. 5, secondary phase-to-phase voltages and phase-to ground voltages are provided to the directional overcurrent relay 24 via voltage transformer groups 52 and 58. More specifically, all of the measured secondary sinusoidal current signals (e.g., $I_{A_S}$, $I_{B_S}$, $I_{C_S}$) and secondary voltages are filtered, sampled and then digitized to form digitized signal sample streams 106 suitable for use by a microcontroller 130 (or field programmable gate array-FPGA) of the directional overcurrent relay 24. As illustrated, the microcontroller 130 includes a microprocessor, or CPU 132, a program memory 134 (e.g., a Flash EPROM) and a parameter memory 136 (e.g., an EEPROM) however other suitable configurations may be used.

The microcontroller 130 is adapted to filter the digitized current sample streams 106 to eliminate DC and unwanted frequency components, and then to calculate a series of phasors, each having a magnitude and phase angle representative of its corresponding measured primary signal. Finally, calculations utilizing the magnitudes and phase angles of phasors are performed to determine if a short circuit or fault exists in the sub-transmission line 20.

For the three-phase ungrounded power system 10, a phase-to-ground fault yields a zero sequence current $I_0$ having a very small magnitude, even for a solidly grounded faulted phase. As the fault resistance $R_f$ increases with respect to the system zero sequence capacitive reactance $XC_{SYS_0}$, the magnitude of the zero sequence current $I_0$ decreases, yielding ever smaller current magnitudes (and corresponding shorter current phasors).

As noted above, the power system described herein is ungrounded. Although not intentionally grounded however, the ungrounded power system 10 is "grounded" by its natural capacitance to ground. As a result, unlike a grounded power system, fault current levels occurring in an ungrounded power system are very low during a phase-to-ground fault, even for a phase-to-ground fault having zero fault resistance (i.e., the faulted phase is solidly grounded). As a consequence, when a phase-to-ground fault occurs in an ungrounded power system, it is difficult to determine which phase of the three-phases is experiencing the fault. And, as noted above, the determination of which phase is experiencing the fault is even more difficult for fault resistances that are greater than the zero sequence capacitance reactance of the power system.

Figure 6:
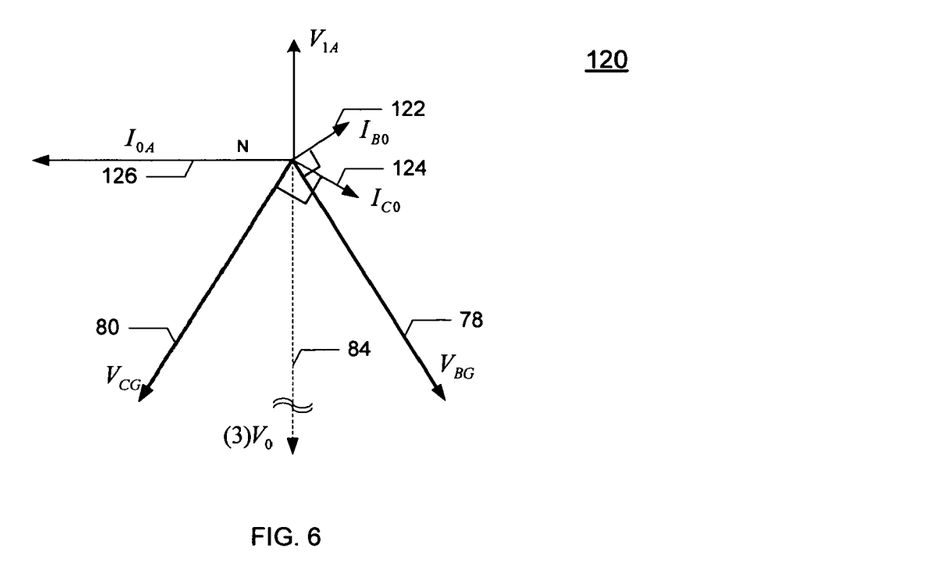
FIG. 6 is a phasor diagram illustrating the phase angle relationship between the fault current and the phase voltages during the A-phase-to-ground fault.

Using the phasor principles described above, during the A-phase-to-ground forward fault (i.e., a fault in front of the relay), fault currents flowing in the un-faulted phases lead their respective un-faulted phase voltages by 90 degrees. For example, FIG. 6 is a phasor diagram 120 illustrating the phase angle relationship between the fault current and the phase voltages during the solid A-phase-to-ground fault. In the un-faulted phases, the fault currents $I_{B0}$ and $I_{C0}$ lead their corresponding phase-to-ground voltages $V_{BG}$ and $V_{CG}$ by 90 degrees. Thus, fault current phasors $I_{B0}$ 122 and $I_{C0}$ 124 lead their corresponding phase-to-ground voltage phasors $V_{BG}$ 78 and $V_{CG}$ 80 by 90 degrees. Also, the residual, or zero sequence current $I_{0A}=-(I_B+I_C)$, lags the zero sequence voltage $V_0$ by 90 degrees. Thus, a zero sequence current phasor $I_0$ 126, lags the zero sequence voltage phasor $V_0$ 84 by 90 degrees for the A-phase-to-ground forward fault.

Although not separately illustrated, for multiple sub-transmission lines or feeders of the ungrounded power system 10, the zero sequence current $I_0$ resulting from, for example, the solid A-phase-to-ground fault on the sub-transmission line 20 leads its corresponding zero sequence voltage $V_0$ by 90 degrees. Accordingly, during a phase-to-ground fault, comparing the zero sequence current phasor 126 $I_0$ to its corresponding zero sequence voltage phasor $V_0$ 84 is determinative of whether a particular transmission line (feeder) is faulted. Thus, if the zero sequence current is leading its corresponding zero sequence voltage, a feeder can be said to be un-faulted, and if the zero sequence current lags its corresponding zero sequence voltage, the feeder can be said to be faulted. Determining which phase of the three-phase faulted feeder is responsible for the fault however, is not a trivial task.

Referring again to FIGS. 3 and 4, the phase-to-phase voltage phasors $V_{CA}$, $V_{BC}$, $V_{AB}$ and associated positive sequence voltage phasors $V_{1A}$ (A-phase), $V_{1B}$, (B-phase), $V_{1C}$ (C-phase) remain substantially the same before and after a phase-to-ground fault. Accordingly, one or more of the phase-to-phase voltage phasors and/or the positive sequence voltage phasors may be used as a fixed reference phasor against which other "moving" operating phasors may be compared.

For example, if the A-phase positive sequence voltage phasor $V_{1A}$ is used as a fixed reference phasor, the solid A-phase-to-ground fault yields a zero sequence voltage phasor $V_0$ rotated 180 degrees from the A-phase positive sequence voltage phasor $V_{1A}$ located at 0 degrees. Similarly, a solid B-phase-to-ground yields a zero sequence voltage phasor $V_0$ rotated +60 degrees from the A-phase positive sequence voltage phasor $V_{1A}$, and a solid C-phase-to-ground fault yields a zero sequence voltage phasor $V_0$ rotated −60 degrees from the A-phase positive sequence voltage phasor $V_{1A}$.

As mentioned above, not every phase-to-ground fault yields zero fault resistance. Therefore, not every phase-to-ground fault yields a zero sequence voltage phasor $V_0$ at 180 degrees, +60 degrees, or −60 degrees.

Rather, the zero sequence voltage phasors $V_0$ may fall within a range. For example, for an A-phase-to-ground fault where the fault resistance is slightly less than the system zero sequence capacitive reactance $XC_{SYS_0}$, the resulting zero sequence voltage phasor $V_0$ may be at +170 degrees rather than +180 degrees, and for an A-phase-to-ground fault where the fault resistance is three times the system zero sequence capacitive reactance $XC_{SYS_0}$, the resulting zero sequence voltage phasor $V_0$ may be at +130 degrees.

Establishing "ranges", or fault sector decision wedges such as, for example, ±60 degrees around 180 degrees for zero sequence voltage phasors $V_0$ due to an A-phase-to-ground fault (i.e., +120 to −120 degrees), ±60 around +60 degrees for a B-phase-to-ground fault (i.e., 0 degrees to +120 degrees), and +60 degrees around −60 degrees for a C-phase-to-ground fault (i.e., 0 degrees to −120 degrees) may enable a determination of which of the A-phase, the B-phase and the C-phase is experiencing the fault.

As the fault resistance $R_f$ increases above the system zero sequence capacitive reactance $XC_{SYS_0}$ however, the resulting zero sequence voltage phasor $V_0$ may not fall within its expected range, and may instead fall within another range. For example, for an A-phase-to-ground fault where the fault resistance $R_f$ is much greater than the system zero sequence capacitive reactance $XC_{SYS_0}$, the resulting zero sequence voltage phasor $V_0$ may be at +90 degrees; within the 0 to +120 degree range established for the B-phase-to-ground fault. Therefore, using established ranges for the location of the resulting zero sequence voltage phasor $V_0$, the A-phase-to-ground fault may erroneously be considered a B-phase-to-ground fault for those cases where the fault resistance $R_f$ is much larger than the system zero sequence capacitive reactance $XC_{SYS_0}$. Similarly, a B-phase-to-ground fault may erroneously be considered a C-phase-to-ground fault for those cases where the fault resistance $R_f$ is much larger than the system zero sequence capacitive reactance $XC_{SYS_0}$, and a C-phase-to-ground fault may erroneously be considered an A-phase-to-ground fault for those cases where the fault resistance $R_f$ is much larger than the system zero sequence capacitive reactance $XC_{SYS_0}$.

Figure 7:
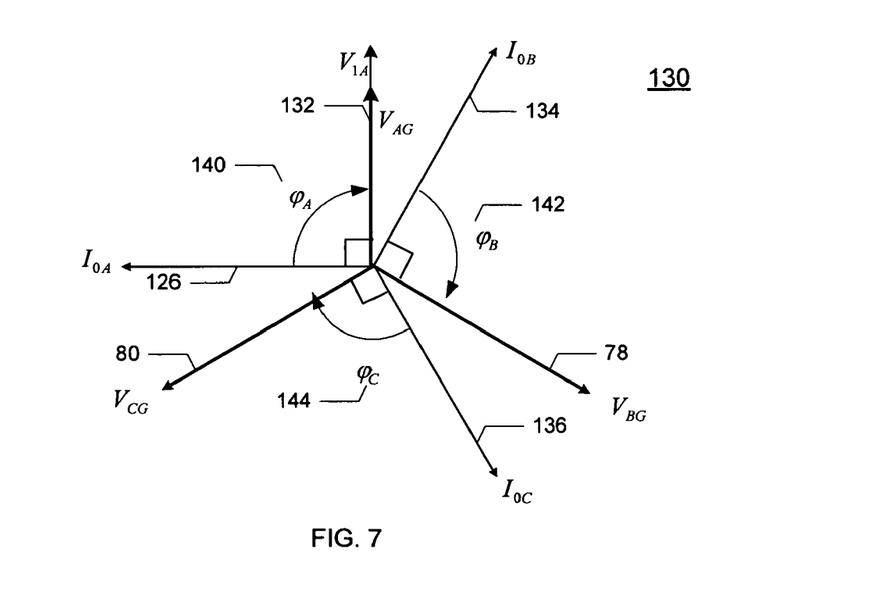
FIG. 7 is another phasor diagram illustrating the phase angle relationship between the zero sequence current phasors and their corresponding phase-to-ground voltage phasors.

FIG. 7 is a phasor diagram 130 illustrating the phase angle relationship between the resulting zero sequence current phasor $I_{0A}$ 126 during an A-phase-to-ground fault and its corresponding A-phase-to-ground phasor $V_{AG}$ 132, the phase angel relationship between a zero sequence current phasor $I_{0B}$ 134 during a B-phase-to-ground fault and its corresponding B-phase-to-ground phasor $V_{BG}$ 78, and the phase angel relationship between a zero sequence current phasor $I_{0C}$ 136 during a C-phase-to-ground fault and its corresponding C-phase-to-ground phasor $V_{CG}$ 80. Although not separately illustrated, a corresponding zero sequence voltage phasor positioned at 180 degrees (A-phase-to-ground fault), a corresponding zero sequence voltage phasor positioned at +60 degrees B-phase-to-ground fault), and a corresponding zero sequence voltage phasor positioned at −60 degrees (C-phase-to-ground fault), may also be included in FIG. 7. Further, although shown together on the phasor diagram 130, it is highly unlikely that that the A-phase-, B-phase- and C-phase zero sequence currents would occur simultaneously.

Referring to FIG. 7, for solid phase-to-ground faults, if a zero sequence current $I_0$ phasor leads the selected reference voltage phasor $V_{1A}$ by about 90 degrees, then the fault is an A-phase-to-ground fault. If a zero sequence current $I_0$ phasor lags the selected reference voltage phasor $V_{1A}$ by about 30 degrees, then the fault is a B-phase-to-ground fault. If a zero sequence current $I_0$ phasor lags the selected reference voltage phasor $V_{1A}$ by about 150 degrees, then the fault is a C-phase-to-ground fault. Thus, for a solid phase-to-ground fault, by comparing a zero sequence current phasor $I_0$ to the reference voltage phasor $V_{1A}$ (e.g., the A-phase positive sequence voltage), the faulted phase can be determined.

As mentioned above, as the fault resistance $R_f$ increases from about zero to a maximum much larger than the system zero sequence capacitive reactance $XC_{SYS_0}$, the zero sequence current phasor $I_0$, rotates clockwise, up to 90 degrees. In other words, with respect to the reference voltage phasor $V_{1A}$ at 0 degrees, an A-phase-to-ground fault yields a zero sequence current phasor located anywhere between 0 to +90 degrees based on the fault resistance $R_f$, a B-phase-to-ground fault yields a zero sequence current phasor located anywhere between −30 to −120 degrees based on the fault resistance $R_f$, and a C-phase-to-ground fault yields a zero sequence current phasor located anywhere between −150 to 120 degrees based on the fault resistance $R_f$, with each of their corresponding phase-to-ground phasors (e.g., C-phase-to-ground phasor $V_{CG}$ 80) leading by 90 degrees.

Referring again to FIG. 7, as the fault resistance $R_f$ increases from about zero to the maximum fault resistance during an A-phase-to-ground fault, an angle $\psi_A$ 140 between the sequence current phasor $I_{0A}$ and its associated A-phase-to-ground phasor $V_{AG}$ 132 decreases as the A-phase zero sequence current phasor $I_{0A}$ "moves" towards its fixed A-phase-to-ground phasor $V_{AG}$ 132 in a clockwise direction. Similarly, as the fault resistance $R_f$ increases from about zero to the maximum fault resistance during a B-phase-to-ground fault an angle $\psi_B$ 142 between the B-phase zero sequence current phasor $I_{0B}$ and its associated B-phase-to-ground phasor $V_{BG}$ 78 decreases as the B-phase zero sequence current phasor $I_{0B}$ moves towards its fixed B-phase-to-ground phasor $V_{BG}$ 78 in a clockwise direction. Similarly during a C-phase-to-ground fault an angle $\psi_C$ 144 between the C-phase zero sequence current phasor $I_{0C}$ and its associated C-phase-to-ground phasor $V_{CG}$ 80 decreases as the C-phase zero sequence current phasor $I_{0C}$ moves towards its fixed C-phase-to-ground phasor $V_{CG}$ 80 in a clockwise direction.

Figure 8:
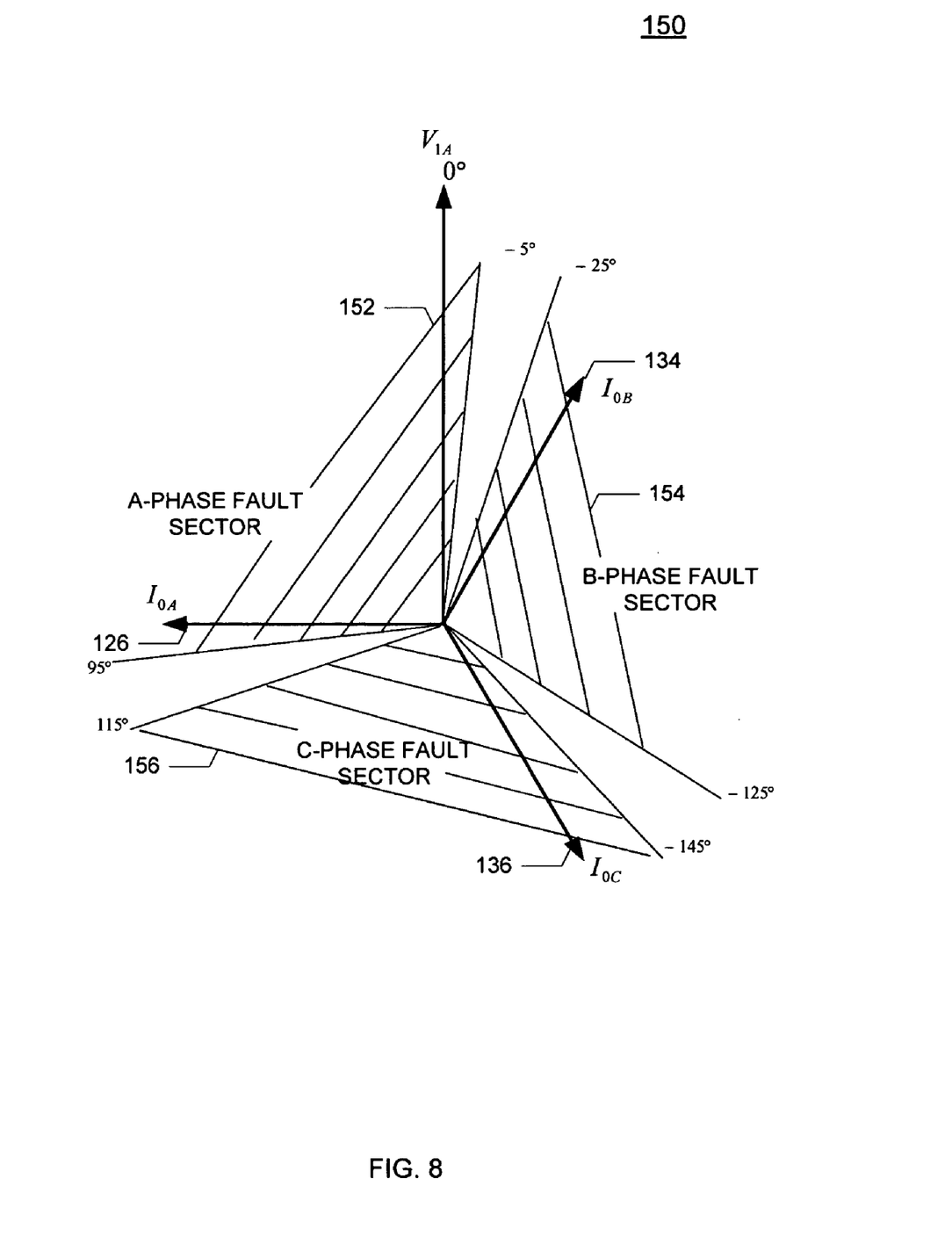
FIG. 8 yet another phasor diagram illustrating fault sector decision wedges having decision wedge boundaries that are selected based on the relationship between a fixed reference and zero sequence current phasors.

FIG. 8 is a phasor diagram 150 illustrating fault sector decision wedges having decision wedge boundaries, according to an embodiment of the invention. The fault sector decision wedges are selected based on the relationship between the A-phase positive sequence voltage $V_{1A}$, utilized as the fixed reference phasor, and the zero sequence current phasors $I_{0A}$, $I_{0B}$ or $I_{0C}$, utilized as the operating phasor(s). As described in connection with FIG. 7, an A-phase-to-ground fault may result in a zero sequence current phasor $I_{0A}$ located anywhere between 0 to +90 degrees based on the fault resistance $R_f$. An A-phase fault sector decision wedge 152 is selected to include the range from 0 to +90 degrees with a buffer zone of 5 degrees on either side. Thus any zero sequence current phasor oriented between about 95 degrees and about −5 degrees, (in the A-phase fault sector decision wedge 152) indicates an occurrence of an A-phase-to-ground fault. Similarly, a B-phase fault sector decision wedge 154 is selected to include the range from −30 to −120 degrees and a buffer zone of 5 degrees on either side. Thus, any zero sequence current phasor oriented between about −25 degrees and about 125 degrees, (in the B-phase fault sector decision wedge 154) indicates an occurrence of a B-phase-to-ground fault. The C-phase fault sector decision wedge 156 is selected to include the range from −150 to 120 and a buffer zone of 5 degrees on either side. Thus, any zero sequence current phasor oriented between about −145 degrees and about 115 degrees, (in the C-phase fault sector decision wedge 156) indicates an occurrence of a C-phase-to-ground fault. Although a 5 degree buffer zones on each of the two sides is included for each of the A-phase fault sector decision wedge 152, the B-phase fault sector decision wedge 154 and the C-phase fault sector decision wedge 156, it is contemplated that smaller, larger or overlapping buffer zones may be utilized.

While FIG. 8 illustrates one example of comparing a phase angle between the A-phase positive sequence voltage phasor $V_{1A}$ and a zero sequence current phasors $I_0$ to a threshold determined by placement of fault sector decision wedges. It is contemplated that one of a number of different "fixed" reference phasors such as the B-phase positive sequence voltage $V_{1B}$, the C-phase positive sequence voltage $V_{1C}$, the $V_{AB}$ phase-to-phase voltage phasor 78, $V_{BC}$ phase-to-phase voltage phasor 82, or the $V_{CA}$ phase-to-phase voltage phasor 80 may be used instead of the A-phase positive sequence voltage phasor $V_{1A}$, and that one of a number of operating phasors such as the zero sequence voltage $V_0$, or combinations of the zero sequence current $I_0$ and the zero sequence voltage $V_0$ may be used instead of the zero sequence current $I_0$ to determine the phase angle.

Figure 9:
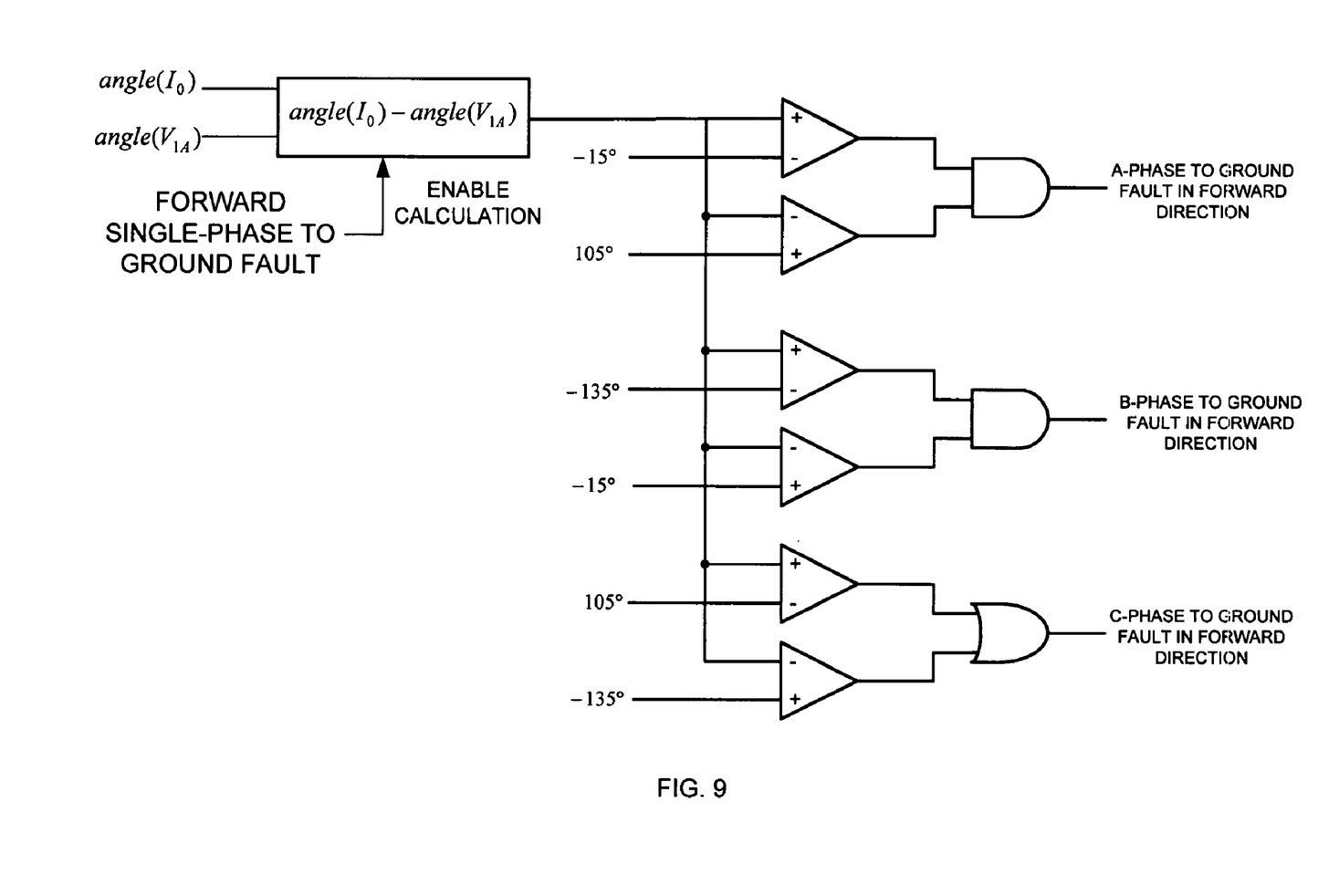
FIG. 9 is a logic diagram of protective device logic that may be used to determine a forward single-phase-to-ground fault on the ungrounded power system of FIG. 1, according to an embodiment of the invention.

FIG. 9 is a logic diagram of protective device logic that may be used to determine a forward single-phase-to-ground fault on the ungrounded power system of FIG. 1, according to an embodiment of the invention. In general, using a comparison between the A-phase positive sequence voltage phasor $V_{1A}$ oriented at zero degrees as the fixed reference phasor and a zero sequence current phasor $I_0$ as the operating phasor, the phase of a forward single-phase-to-ground fault can be identified. As noted above, other fixed reference phasors and operating phasors may be utilized instead of the A-phase positive sequence voltage phasor $V_{1A}$ and the zero sequence current phasor $I_0$.

More specifically, after an occurrence of a forward single-phase-to-ground fault has been determined, if the difference between a phase angle of the zero sequence current phasor $I_0$ and the phase angle of the A-phase positive sequence voltage phasor $V_{1A}$ (i.e., angle($I_0$)−angle($V_{1A}$)) is greater than −15 degrees and less than 105 degrees, the forward single-phase-to-ground fault is a forward A-phase phase-to-ground fault. Similarly, for a forward single-phase-to-ground fault, if the difference between the phase angle of the zero sequence current phasor $I_0$ and the phase angle of the A-phase positive sequence voltage phasor $V_{1A}$ is greater than −135 degrees and less than −15 degrees, the forward single-phase-to-ground fault is a forward B-phase phase-toground fault, and if the difference between the phase angle of the zero sequence current phasor $I_0$ and the phase angle of the A-phase positive sequence voltage phasor $V_{1A}$ is greater than 105 degrees or less than −135 degrees, the forward single-phase-to-ground fault is a forward C-phase phase-to-ground fault.

Figure 10:
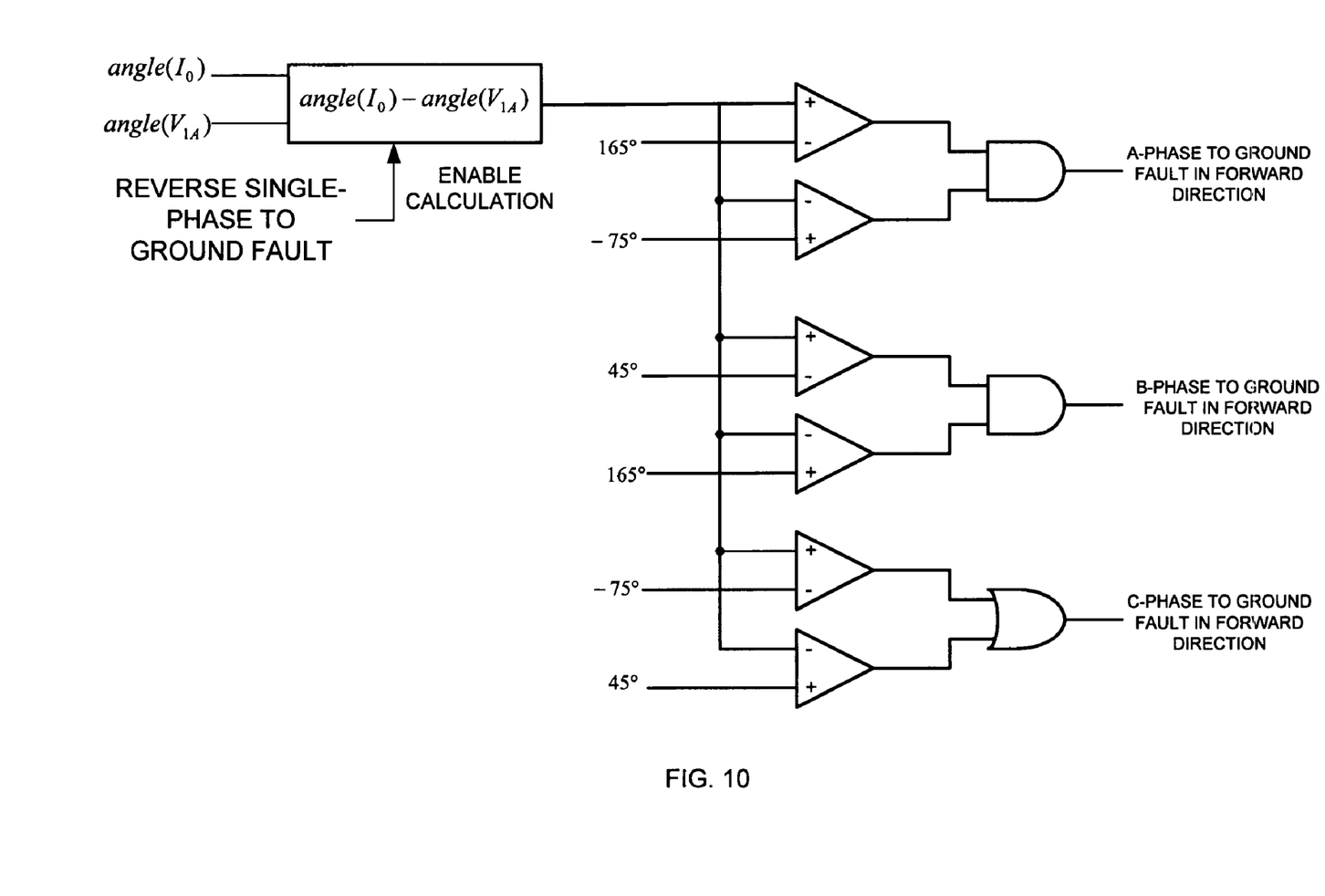
FIG. 10 is a logic diagram of protective device logic that may be used to determine a reverse single-phase-to-ground fault on the ungrounded power system of FIG. 1, according to an embodiment of the invention.

FIG. 10 is a logic diagram of protective device logic that may be used to determine a reverse single-phase-to-ground fault on the ungrounded power system of FIG. 1, according to an embodiment of the invention. In general, using a comparison between the A-phase positive sequence voltage phasor $V_{1A}$ oriented at zero degrees as the fixed reference phasor and a zero sequence current phasor $I_0$ as the operating phasor, the phase of a reverse single-phase-to-ground fault can be identified.

More specifically, after an occurrence of a reverse single-phase-to-ground fault has been determined, if the difference between the phase angle of the zero sequence current phasor $I_0$ and the phase angle of the A-phase positive sequence voltage phasor $V_{1A}$ is greater than 165 degrees and less than −75 degrees, the reverse single-phase-to-ground fault is a reverse A-phase phase-to-ground fault. Similarly, for a reverse single-phase-to-ground fault, if the difference between the phase angle of the zero sequence current phasor $I_0$ and the phase angle of the A-phase positive sequence voltage phasor $V_{1A}$ is greater than 45 degrees and less than 165 degrees, the reverse single-phase-to-ground fault is a reverse B-phase phase-to-ground fault, and if the difference between the phase angle of the zero sequence current phasor $I_0$ and the phase angle of the A-phase positive sequence voltage phasor $V_{1A}$ is greater than −75 degrees or less than 45 degrees, the reverse single-phase-to-ground fault is a forward C-phase phase-to-ground fault. As Will be appreciated by one skilled in the art, the boundary phase angles may vary, depending on the fixed reference phasor selected and the operating phasor selected.

While this invention has been described with reference to certain illustrative aspects, it will be understood that this description shall not be construed in a limiting sense. Rather, various changes and modifications can be made to the illustrative embodiments without departing from the true spirit, central characteristics and scope of the invention, including those combinations of features that are individually disclosed or claimed herein. For example, the apparatus and method for determining a faulted phase is applicable to both forward faulted phases and reverse faulted phases. Furthermore, it will be appreciated that any such changes and modifications will be recognized by those skilled in the art as an equivalent to one or more elements of the following claims, and shall be covered by such claims to the fullest extent permitted by law.

What is claimed is:

1. An apparatus for determining a faulted phase resulting from a fault in a three-phase ungrounded power system, the apparatus comprising:

a means for deriving a plurality of digitized signal samples from a corresponding plurality of measured signals of the three-phase ungrounded power system; and a microcontroller operatively coupled to the means for deriving, the microcontroller having a microprocessor and a memory operatively coupled to the microprocessor, the microcontroller being programmed to:

calculate a magnitude and phase angle of a fixed reference phasor, determine an operating phasor, calculate a magnitude and phase angle of the operating phasor based on at least one of the plurality of digitized signal samples, compute a phase angle difference between the operating phasor and the fixed reference phasor, and compare the phase angle difference to at least one threshold to determine the faulted phase.

2. The apparatus of claim 1, wherein the microcontroller is further programmed to detect a forward single-phase-to-ground fault prior to computing the phase angle difference between the operating phasor and the fixed reference phasor.

3. The apparatus of claim 1, wherein the microcontroller is further programmed to detect a reverse single-phase-to-ground fault prior to computing the phase angle difference between the operating phasor and the fixed reference phasor.

4. The apparatus of claim 1, wherein the fixed reference phasor is selected from the group consisting of a phase-to-phase voltage signal of the plurality of measured signals, and a positive sequence voltage signal of the plurality of measured signals.

5. The apparatus of claim 1, wherein the operating phasor is selected from the group consisting of a zero sequence current signal of the plurality of measured signals, a zero sequence voltage signal of the plurality of measured signals, and a combination of a zero sequence current signal and a zero sequence voltage signal of the plurality of measured signals.

6. The apparatus of claim 1, wherein the at least one threshold comprises a fault sector decision wedge of a phasor diagram, the fault sector decision wedge based on a fault resistance range of the fault.

7. The apparatus of claim 6, wherein the fault resistance range includes a plurality of fault resistances having values larger than a zero sequence capacitive reactance of the three-phase ungrounded power system.

8. The apparatus of claim 6, wherein a faulted A-phase is indicated if the phase angle difference locates the operating phasor in a first fault sector decision wedge, wherein a faulted B-phase is indicated if the phase angle difference locates the operating phasor in a second fault sector decision wedge, and wherein a faulted C-phase is indicated if the phase angle difference locates the operating phasor in a third fault sector decision wedge.

9. The apparatus of claim 8, wherein the operating phasor comprises an A-phase positive sequence voltage and the fixed reference phasor comprises a zero sequence current, and wherein the first fault sector decision wedge includes a phasor diagram area between about −5 to about +95 degrees, the second fault sector decision wedge includes a phasor diagram area between about −55 to about −125 degrees and the third fault sector decision wedge includes a phasor diagram area between about between about −145 to about +115 degrees.

10. The Apparatus of claim 1, wherein the fault comprises a resistance that is greater than a zero-sequence capacitive reactance of the three-phase ungrounded power system.

11. A method for determining a faulted phase resulting from a fault in a three-phase ungrounded power system, the method comprising:

comparing a phase angle of an operating phasor to a phase angle of a fixed reference phasor, the operating phasor derived from a digitized signal sample of a plurality of measured signals of the ungrounded power system; and comparing a phase angle difference between the operating phasor and the fixed reference phasor to at least one threshold to determine the faulted phase.

12. The method of claim 11, further comprising detecting a forward single-phase-to-ground fault prior to comparing the phase angle difference between the operating phasor and the fixed reference phasor.

13. The method of claim 11, further comprising detecting a reverse single-phase-to-ground fault prior to comparing the phase angle difference between the operating phasor and the fixed reference phasor.

14. The method of claim 11, wherein the fixed reference phasor is selected from the group consisting of a phase-to-phase voltage of the plurality of measured signals of the power system, and a positive sequence voltage of the plurality of measured signals of the power system.

15. The method of claim 11, wherein the operating phasor is selected from the group consisting of a zero sequence current of the plurality of measured signals of the power system, a zero sequence voltage of the plurality of measured signals of the power system, and a combination of a zero sequence current and a zero sequence voltage of the plurality of measured signals of the power system.

16. The method of claim 11, wherein the at least one threshold comprises a fault sector decision wedge of a phasor diagram, the fault sector decision wedge based on a fault resistance range of the fault.

17. The method of claim 16, wherein the fault resistance range includes a plurality of fault resistances having values larger than a zero sequence capacitive reactance of the three-phase ungrounded power system.

18. The method of claim 16, wherein a faulted A-phase is indicated if the phase angle difference locates the operating phasor in a first fault sector decision wedge, wherein a faulted B-phase is indicated if the phase angle difference locates the operating phasor in a second fault sector decision wedge, and wherein a faulted C-phase is indicated if the phase angle difference locates the operating phasor in a third fault sector decision wedge.

19. The method of claim 11, wherein the fault comprises a resistance that is greater than a zero-sequence capacitive reactance of the three-phase ungrounded power system.

20. A method for determining a faulted phase resulting from a fault in a three-phase ungrounded power system, the method comprising:
calculating a magnitude and phase angle of a fixed reference phasor, the fixed reference phasor derived from a first digitized signal sample of a plurality of measured signals of the ungrounded power system;
calculating a magnitude and phase angle of an operating phasor, the operating phasor derived from a second digitized signal sample of the plurality of measured signals of the ungrounded power system;
computing a phase angle difference between the operating phasor and the fixed reference phasor; and
comparing the phase angle difference to at least one threshold to determine the faulted phase.

21. The method of claim 20, further comprising detecting a forward single-phase-to-ground fault prior to computing the phase angle difference between the operating phasor and the fixed reference phasor.

22. The method of claim 20, further comprising detecting a reverse single-phase-to-ground fault prior to computing the phase angle difference between the operating phasor and the fixed reference phasor.

23. The method of claim 20, wherein the fixed reference phasor is selected from the group consisting of a phase-to-phase voltage of the plurality of measured signals of the power system, and a positive sequence voltage of the plurality of measured signals of the power system.

24. The method of claim 20, wherein the operating phasor is selected from the group consisting of a zero sequence current of the plurality of measured signals of the power system, a zero sequence voltage of the plurality of measured signals of the power system, and a combination of a zero sequence current and a zero sequence voltage of the plurality of measured signals of the power system.

25. The method of claim 20, wherein the at least one threshold comprises a fault sector decision wedge of a phasor diagram, the fault sector decision wedge based on a fault resistance range of the fault.

26. The method of claim 25, wherein the fault resistance range includes a plurality of fault resistances having values larger than a zero sequence capacitive reactance of the three-phase ungrounded power system.

27. The method of claim 25, wherein a faulted A-phase is indicated if the phase angle difference locates the operating phasor in a first fault sector decision wedge, wherein a faulted B-phase is indicated if the phase angle difference locates the operating phasor in a second fault sector decision wedge, and wherein a faulted C-phase is indicated if the phase angle difference locates the operating phasor in a third fault sector decision wedge.

28. The method of claim 27, wherein the operating phasor comprises an A-phase positive sequence voltage and the fixed reference phasor comprises a zero sequence current, and wherein the first fault sector decision wedge includes a phasor diagram area between about −5 to about +95 degrees, the second fault sector decision wedge includes a phasor diagram area between about −55 to about −125 degrees and the third fault sector decision wedge includes a phasor diagram area between about between about −145 to about +115 degrees.

29. The method of claim 20 wherein the fault comprises a resistance that is greater than a zero-sequence capacitive reactance of the three-phase ungrounded power system.

* * * * *